(12) United States Patent
Du Mee et al.

(10) Patent No.: US 7,307,689 B2
(45) Date of Patent: Dec. 11, 2007

(54) LITHOGRAPHIC APPARATUS, RETICLE MASKING DEVICE FOR A LITHOGRAPHIC APPARATUS, GAS BEARING AND APPARATUS COMPRISING SUCH GAS BEARING

(75) Inventors: Maurice Philippe Du Mee, Eindhoven (NL); Edwin Johan Buis, Belfeld (NL); Johannes Adrianus Antonius Theodorus Dams, Veldhoven (NL); Johannes Andreas Henricus Maria Jacobs, Veldhoven (NL); Antoine Hendrik Verweij, Dussen (NL); Erik Maria Rekkers, Boxtel (NL)

(73) Assignee: ASML Netherlands B.V., Veldhoven (NL)

( * ) Notice: Subject to any disclaimer, the term of this patent is extended or adjusted under 35 U.S.C. 154(b) by 314 days.

(21) Appl. No.: 11/024,042

(22) Filed: Dec. 29, 2004

(65) Prior Publication Data

US 2006/0139615 A1 Jun. 29, 2006

(51) Int. Cl.
*G03B 27/42* (2006.01)
*G03B 27/54* (2006.01)
*G03B 27/62* (2006.01)

(52) U.S. Cl. .............................. 355/53; 355/67; 355/75
(58) Field of Classification Search ................. 355/53, 355/72–76; 310/10, 12; 318/649, 687
See application file for complete search history.

(56) References Cited

U.S. PATENT DOCUMENTS

| 6,509,957 B1 * | 1/2003 | Tanaka ........................ 355/72 |
| 6,654,100 B2 * | 11/2003 | Yoda ............................ 355/53 |
| 6,717,296 B2 | 4/2004 | Hol et al. ..................... 310/12 |
| 7,057,370 B2 * | 6/2006 | Touzov ........................ 318/687 |

* cited by examiner

*Primary Examiner*—Henry Hung Nguyen
(74) *Attorney, Agent, or Firm*—Pillsbury Winthrop Shaw Pittman LLP

(57) ABSTRACT

A lithographic apparatus includes a guiding mechanism to guide a movable structure such as a mask blade of a reticle masking device, a movable part connected to the movable structure, and a substantially stationary part to guide the movable part. The movable part includes a nozzle to inject a gas in a gap between the movable and stationary parts, a contactless supply of the gas from the stationary part to the movable part being provided by a gas supply outlet in the stationary part and a gas supply inlet in the movable part. The gas supply outlet includes an inlet trench in a surface of the movable part facing the gas supply outlet of the stationary part, the trench being orientated parallel to a direction of movement of the movable part. The movable part includes a motor drive part and a counter weight part connected to an end of the motor drive part facing away from the movable structure.

22 Claims, 5 Drawing Sheets

LITHOGRAPHIC APPARATUS, RETICLE MASKING DEVICE FOR A LITHOGRAPHIC APPARATUS, GAS BEARING AND APPARATUS COMPRISING SUCH GAS BEARING

FIELD

The present invention relates to a lithographic apparatus, a guiding mechanism for use in a lithographic apparatus, a gas bearing device and a reticle masking device for use in such lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that circumstance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate The patterning device may be transmissive or reflective. In both cases, the patterning device includes a pattern, the pattern either influencing a transmission or a reflection of a part of the patterning device. The pattern may, e.g., include a patterned layer of a metal such a chrome. To prevent a transfer (i.e. a transmission or a reflection) of radiation outside a useful (e.g. patterned) part of the patterning device. A remainder of a surface of the patterning device may be covered with a material preventing transmission, resp. reflection. A manufacturing of such a layer on the patterning device is highly costly and needs to comply with high optical standards to prevent any transmission of radiation at a part of the patterning device where such transmission is not desired. Commonly, a lithographic apparatus over its lifetime makes use of a plurality of different patterning devices. To lower a cost of manufacturing of such patterning devices and/or to relax requirements thereon, a so-called reticle masking device may be provided in the lithographic apparatus. The reticle masking device masks an unused, i.e. "a blind" part of the reticle, the reticle masking device thus preventing an irradiation of the unused part of the reticle, and therefore relaxing requirements in terms of residual transmission resp. residual reflection thereof In a so-called scanner, and possibly also in other types of lithographic apparatuses, the reticle makes a scanning movement following a scanning of the substrate. The reticle masking device is required to follow at least a part of the movements of the reticle to be able to effectively mask an unused part of the reticle. In conventional lithographic apparatus, it is common that the reticle masking device is physically smaller then the reticle itself, as the reticle masking device is positioned in an optical projection system of the lithographic apparatus at a position where the reticle masking device will be optically enlarged to scale it to a size of the reticle. In future designs of lithographic apparatuses, due to requirements of the projection system, such a scaling of the reticle masking device with respect to the reticle is to be prevented to meet a variety of design requirements of the lithographic apparatus. Therefore, a dimension of the reticle masking device is required to increase, in a practical embodiment, e.g., by a factor 4 in all three dimensions, hence significantly increasing its building volume and mass. Also, due to the larger physical dimensions of the reticle masking device, accelerations and decelerations thereof to follow a scanning movement of the reticle, will increase. Also, the higher mass in combination with the larger accelerations will require much higher forces to accelerate and decelerate the mask as well as potentially result in much higher disturbances (i.e. mechanical evaporations) in a remainder of the lithographic apparatus.

SUMMARY

It is desirable to provide an improved guiding mechanism for a movable part, such as a reticle masking device.

According to an embodiment of the invention, there is provided a lithographic apparatus having a guiding mechanism to guide a movable structure, the guiding mechanism including: a movable part connected to the movable structure, and a substantially stationary part to guide the movable part, wherein the movable part includes at least one nozzle to inject a gas in a gap between the movable part and the stationary part, the stationary part including a gas supply outlet to supply a gas via a part of the gap to a gas supply inlet comprised in the movable part, the movable part including a gas supply conduct to guide the gas from the gas supply inlet to the at least one nozzle.

According to an embodiment of the invention, there is provided a reticle masking device for a lithographic apparatus, including: a mask blade and a guiding mechanism to guide the mask blade, the guiding mechanism including a movable part connected to the mask blade, and a substantially stationary part to guide the movable part, wherein the movable part includes a gas nozzle to inject a gas in a gap between the movable part and the stationary part, the stationary part including a gas supply outlet to supply a gas via a part of the gap to a gas supply inlet comprised in the movable part, the movable part including a gas supply conduct to guide the gas from the gas supply inlet to the at least one nozzle.

According to an embodiment of the invention, there is provided a gas bearing to bear a movable part with respect to a substantially stationary part, wherein the movable part includes a gas nozzle to inject a gas in a gap between the movable part and the stationary part, the stationary part including a gas supply outlet to supply a gas via a part of the gap to a gas supply inlet comprised in the movable part, the movable part including a gas supply conduct to guide the gas from the gas supply inlet to the at least one nozzle.

According to an embodiment of the invention, there is provided an apparatus including the gas bearing according to the invention.

In another embodiment of the invention, there is provided a lithographic apparatus including: an illumination system configured to condition a beam of radiation; a patterning device support configured to support a patterning device, the patterning device configured to pattern the beam of radiation to form a patterned beam of radiation; a substrate support configured to hold a substrate; a projection system configured to project the patterned beam of radiation onto a target portion on the substrate, and a guiding mechanism configured to guide a movable structure within the lithographic apparatus, the guiding mechanism including (a) a movable part connected to the movable structure, and (b) a substantially stationary part configured to guide the movable part, wherein the movable part includes a nozzle configured to inject gas in a gap between the movable part and the stationary part, a gas supply inlet, and a gas supply conduit, wherein the stationary part includes a gas supply outlet configured to supply gas via a part of the gap to the gas supply inlet arranged in the movable part, and wherein the gas supply conduit is configured to guide the gas from the gas supply inlet to the nozzle.

BRIEF DESCRIPTION OF THE DRAWINGS

Embodiments of the invention will now be described, by way of example only, with reference to the accompanying schematic drawings in which corresponding reference symbols indicate corresponding parts, and in which.

In the figures, identical reference numbers and reference symbols refer to identical or similar items.

DETAILED DESCRIPTION

Figure 1:
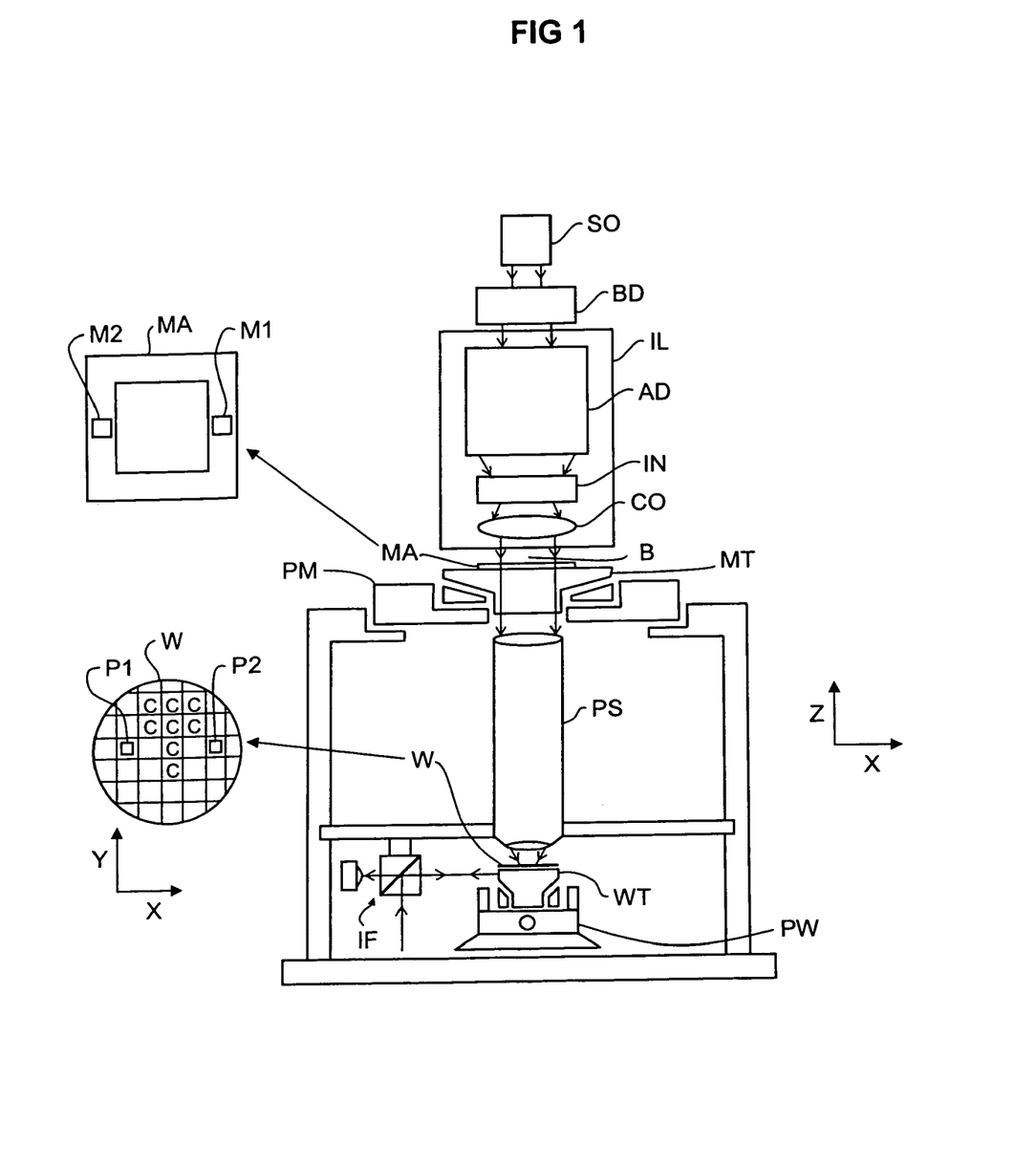
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or EUV radiation) and a support structure (e.g. a mask table) MT constructed to support a patterning device (e.g. a mask) MA and connected to a first positioner PM configured to accurately position the patterning device in accordance with certain parameters. The apparatus also includes a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

Step mode: the mask table MT and the substrate table WT are kept essentially stationary, while an entire pattern imparted to the radiation beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

Scan mode: the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

Another mode: the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
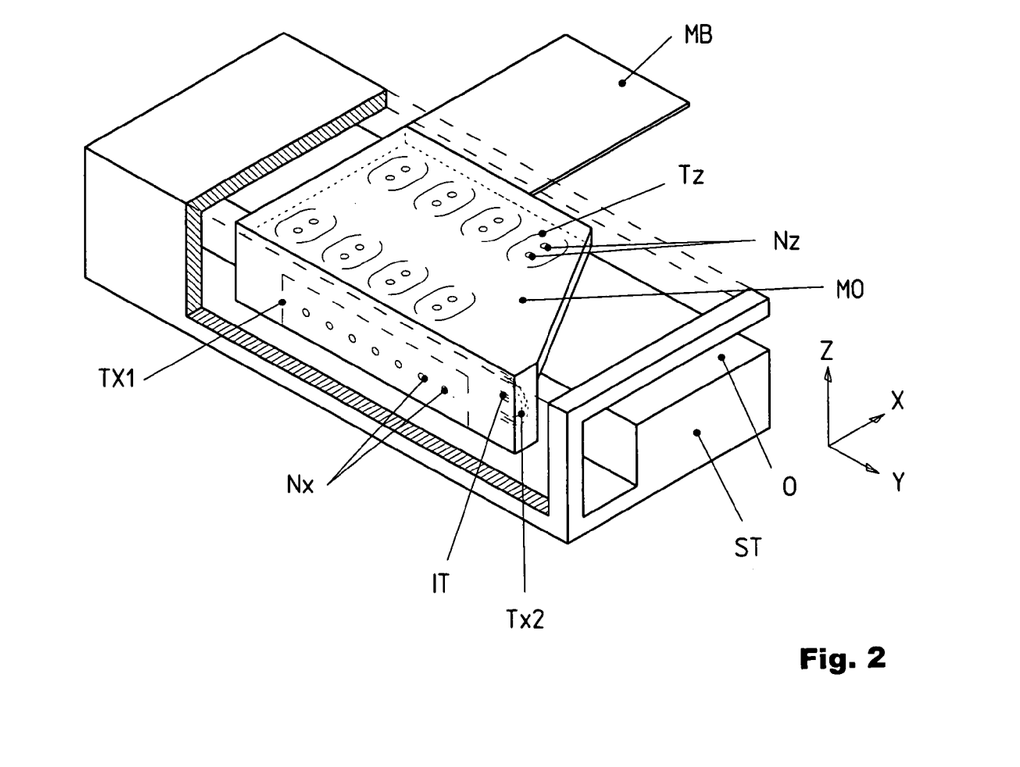
FIG. 2 depicts a perspective view of a guiding mechanism of the lithographic apparatus according to an embodiment of the invention.

FIG. 2 depicts a partly cut out view of a drive mechanism according to an embodiment of the invention. The drive mechanism drives a mask blade MB (or in general terms it could drive any movable structure), the mask blade MB being connected to a movable part MO of the drive mechanism. The drive mechanism further includes a stationary part ST, a part of which has been cut out in FIG. 2 for clarification. As will be clear to the skilled person when studying FIG. 2, such part of the stationary part ST has been cut out which would in the position of the movable part MO as depicted in FIG. 2, cover the movable part MO. This cut out part has been indicated by the dotted lines, an edge of the cut out having been indicated by dashed lines along the cut out section of the stationary part. FIG. 2 further depicts a 3-dimensional coordinate system including an x, y and z axis which will be referred to in the below.

As shown in FIG. 2, the stationary part ST includes an opening for guiding the movable part MO, the opening O having, when observed in the direction along the y axis, a shape of an L. When looking at the movable part from the same direction, the movable part is also L shaped, thus being guided by the opening O in the stationary part ST (assuming of course that the section of the stationary part ST which has been cut out in the drawing for clarity purposes is present). Dimensions of the movable part MO are chosen to be slightly smaller than dimensions of the opening O in the stationary part ST, thus leaving a small gap between the stationary part ST and the movable part MO along the x direction, as well as the z direction. The movable part MO includes gas nozzles to inject a gas in the gap between the movable part and the stationary part. In the example shown in FIG. 2, a plurality of nozzles $N_x$ is shown as well as a plurality of nozzles $N_z$. The nozzles $N_x$, $N_z$ are connected to a gas supply conduct to guide a gas to the nozzles $N_x$, $N_z$. By injecting a gas in the gap between a surface of the movable part MO in which the respective nozzle is comprised, and a surface of the stationary part ST facing the surface of the movable part MO, a gas bearing is formed to bear the movable part MO with respect to the stationary part ST in the dimension of the respective nozzle. The nozzles $N_x$ provide for a bearing in an x direction while the nozzles $N_z$ provide for a bearing in the z direction. The surface of the movable part in which the nozzles $N_x$ are comprised and the surface of the movable part in which the nozzles $N_z$ are comprised, are substantially perpendicular to each other to achieve a maximum position accuracy of the movable part with respect to the stationary part.

FIG. 2 further shows a plurality of trenches comprised in the movable part MO, the trenches being located on a surface of the movable part and circumferring or enclosing in this example a plurality of nozzles. A trench $T_{x1}$ is provided circumferring the nozzles $N_x$ while a plurality of trenches $T_z$ are provided each circumferring to nozzles $N_z$. The trenches enable to drain the gas injected into the gap by the respective nozzle or nozzles which is resp. are circumferred by the trench. The trenches are connected (e.g. via a suitable conduct comprised in the movable part) to a gas exhaust the functioning of which will be explained below. The trenches $T_{x1}$ and $T_z$ as shown in FIG. 2 may include a slit, a trench, or any other suitable form in a surface of the movable part.

Figure 3:
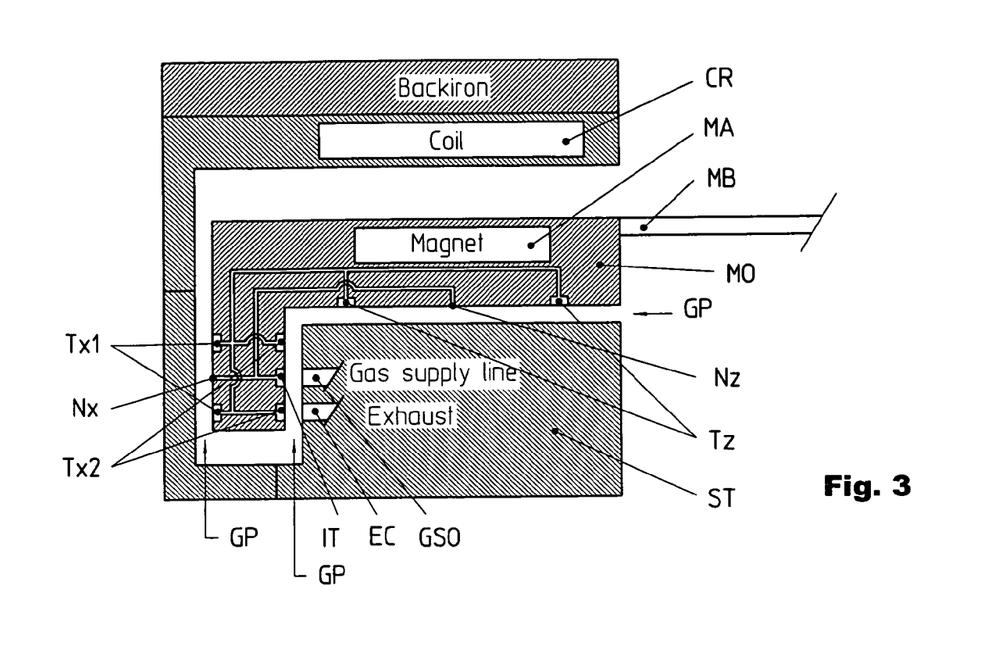
FIG. 3 depicts a cross sectional view of the guiding mechanism according to FIG. 2.

A gas supply of the guiding mechanism as well as the exhaust will now be described with reference to FIG. 3. The sectional view as shown in FIG. 3 includes a view along the y axis. FIG. 3 shows one of the nozzles $N_x$ and one of the nozzles $N_z$ as well as a sectional view through two parts of the trenches $T_z$ and two parts of the trenches $T_{x1}$. An example of a cross sectional shape of the trenches $T_{x1}$, $T_z$ can also be taken from FIG. 3. The nozzles $N_x$, $N_z$ are connected to a gas supply conductor or conduit CO to supply the gas to the respective nozzles. Likewise, the trenches $T_{x1}$, $T_z$ are connected to gas drainage conductors or conduits DCO to drain the gas from the respective trenches. The gas is supplied from the stationary part ST to the movable part MO in a manner which will be described below. The stationary part ST includes a gas supply outlet GSO which terminates in the gap GP. Via the gas supply outlet GSO a gas is forced (e.g. by applying a suitable pressure) to flow via the gas supply outlet GSO into the gap GP. The movable part MO includes a gas supply inlet, in this example an inlet trench IT which faces the gas supply outlet GSO comprised in the stationary part ST. The inlet trench IT is connected to the gas supply conduct CO. Thus, gas which is supplied to the gas supply outlet GSO of the stationary part ST flows from the gas supply outlet GSO into gap GP, a part of the gas then flowing from the gap GP into the inlet trench IT and from there to the gas supply conduct CO. Another part of the gas which flows into the gap GP escapes into the gap, thus effectively forming a gas supply leakage. With the gas supply outlet GSO and the inlet trench IT, a contactless transfer of the gas from the stationary part ST to the movable part MO is achieved. To be able to allow the movable part to move with respect to the stationary part ST in a direction along the y axis, the inlet trench includes an elongated trench which extends in a direction substantially parallel to the y axis, thus enabling a movement of the movable part in a direction substantially parallel to the y axis while ensuring (over a range of movement of the movable part MO with respect to the stationary part ST) a flow of the gas from the gas supply outlet to a part of the inlet trench IT which faces the gas supply outlet in a respective position of the movable part MO with respect to the stationary part ST. The gas leakage occurring between the gas supply outlet GSO and the inlet trench IT, thus the part of the gas which leaks away into the gap provides for a preload on the gas bearing formed by the nozzles $N_x$. Gas flowing out of the nozzles $N_x$ provides for a force on the movable part MO n a direction to the right in the plane of drawing. The leakage of gas between the gas supply outlet GSO and the inlet trench IT provides for a force on the movable part MO to the left in the plane of drawing, as the gas supply inlet of the movable part (thus in this example the inlet trench IT) and the nozzle $N_x$ are located on surfaces on opposite sides of the movable part. Thus, the gas leakage into the gap forms a preload on the gas bearing provided by the nozzles $N_x$. Alternative ways of providing a preload will be discussed below.

FIG. 3 further shows an exhaust conduct EC comprised in the stationary part. The exhaust conduct EC faces a part of one of the trenches $T_{x2}$. The outlet trench $T_{x2}$ is connected to the drainage conductor or conduit DCO to guide the gas from the drainage trenches $T_{x1}$, $T_z$ to the trench $T_{x2}$. In the embodiment shown in FIG. 3, the trench $T_{x2}$ has dual functions: first, it collects gas which leaks away between the gas supply output GSO and the inlet trench IT, and secondly it forms a drainage trench to guide the gas to the exhaust conductor or conduit EC. At least a part of the trench $T_{x2}$ extends in a direction substantially parallel to the y axis thus enabling a drainage of the gas into the exhaust in a range of movement of the movable part MO with respect to the stationary part ST, as in each position within the range of movement a part of the trench $T_{x2}$ faces the exhaust conductor EC. In the embodiment shown in FIG. 3, the exhaust conductor includes an atmospheric exhaust, however it is also possible that a forced exhaust, e.g. making use of under pressure by e.g. a pump, is applied to facilitate drainage of the gas via the exhaust.

FIG. 3 further schematically shows parts of a motor to drive the movable part MO with respect to the stationary part ST. The motor includes a linear motor including an array of magnets, or first part, and an array of coils, or second part. FIG. 3 shows a cross sectional view through one of the magnets MA as well as one of the coils CL (a single- or a multi-dimensional array of coils and/or magnets may be present). As shown in FIG. 3, the movable part MO thus comprises a motor drive part in which the magnet MA is located and a counter weight part formed by the left side of the movable part MO in the plane of drawing, thus formed by the part including the trenches $T_{x1}$ and $T_{x2}$, the nozzles $N_x$ and the inlet trench IT, etc. Due to this counter weight part, a weight of the mask blade MB is at least partly balanced, thus reducing a torque on the movable part MO with respect to the stationary part ST, as a mass of the mask blade MB is at least partly balanced by a counter weight mass of the left side of the movable part MO in the plane of drawing. In the embodiment shown in FIG. 3 the surface in which the nozzles $N_z$ are comprised, is comprised in the motor drive part, while the surface in which the nozzles $N_x$ are comprised is comprised in the counter weight part, thus further decrease a possible rotation of the movable part MO with respect to the stationary part, when the coils CL are operated, as the gas bearing formed by the nozzles $N_x$ further reduces any possible rotation of the movable part MO with respect to the stationary part due to mass imbalances or other dynamic effects. In the embodiment shown in FIG. 3, the movable part includes the magnet MA while the stationary part includes the coil CL, which reduces any heating effects, as a generation of heat in the coil CL when in operation, can more easily be handled than a generation of heat in the movable part, as the stationary part ST offers sufficient possibilities for heat sinking, contrary to the movable part MO (a mass of which is to be kept preferably low to enable high accelerations and decelerations). According to the invention, the magnet MA also forms a preload for the gas bearing provided by the nozzles $N_z$. A gas flowing out of the nozzles $N_z$ will provide for a force in an upward direction in the plane of drawing according to FIG. 3. This force is counter-acted by a force caused by the magnet MA which is attracted by an e.g. ferro magnetic material in the stationary part, the ferro magnetic material, e.g. including an iron. In FIG. 3, the ferro magnetic material has not been shown in detail, however in a practical embodiment the stationary part ST may be constructed out of an iron or other ferro magnetic material for a substantial part thereof. A distance between the magnet and the ferro magnetic material of the stationary part ST is smaller between the magnet MA and a part of the stationary part ST facing the nozzles $N_z$ than between the magnet and a part of the stationary part ST holding and/or at least partly surrounding the coil CL. Thus, an effective magnetic force in a downward direction (in the plane of drawing) is generated which provides a preload on the gas bearing in operation formed by the nozzles $N_z$.

In a further embodiment, the gas bearings—which are formed in operation by the nozzles $N_z$—are positioned with respect to the magnets MA such that bending forces in the moving part are reduced to a minimum. This is achieved by positioning the magnets MA and the coils Co such that along the surface of the movable part facing the gap, in which surface the nozzles $N_z$ are positioned, a location of a maximum of a magnetic preload force by the magnets MA substantially coincides with a location of a maximum force generated in operation by the gas bearings formed by the nozzles $N_z$. A multiple of such substantially coinciding maximums may be present e.g. forming a single or two dimensional array. As an example, it may be possible that, each of the nozzles $N_z$ is located in a center below a magnet of the array of magnets MA to reduce bending forces in the movable part.

Figure 4A:
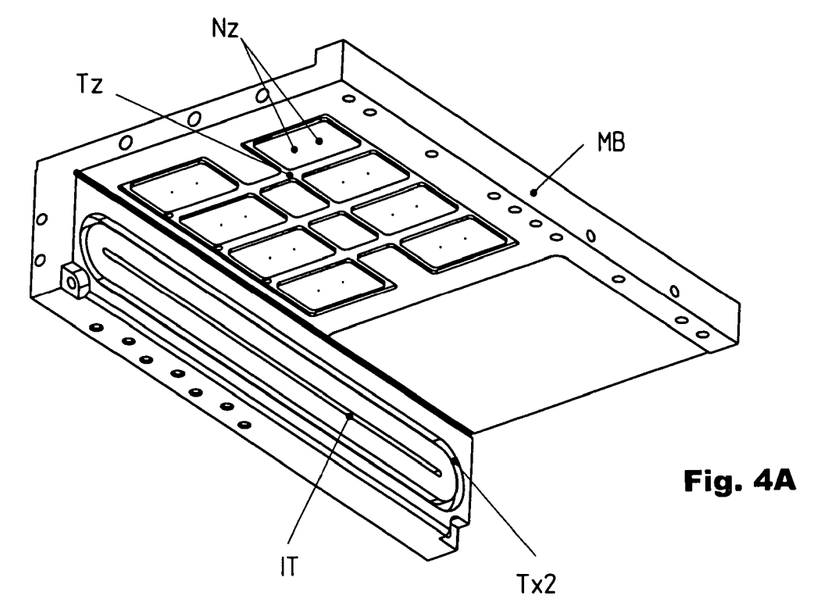
FIGS. 4a and b depict a perspective view of a moving part of the guiding mechanism according to FIG. 2.

FIG. 4a shows a perspective view of the movable part seen in a "see through" view. As can be seen from FIG. 4a, the movable part MO includes an elongated inlet trench IT which cooperates with the gas supply outlet GSO in the stationary part as described with reference to FIG. 3, and an elongated trench $T_{x2}$, the elongated trench $T_{x2}$ to collect gas leaking away between the supply outlet GSO and the inlet trench IT, and to guide drained and/or leaked gas to the exhaust conductor EC as has also been described above with reference to FIG. 3. Further, in FIG. 4a, trenches $T_z$ surrounding nozzles $N_z$ are depicted.

Figure 4B:
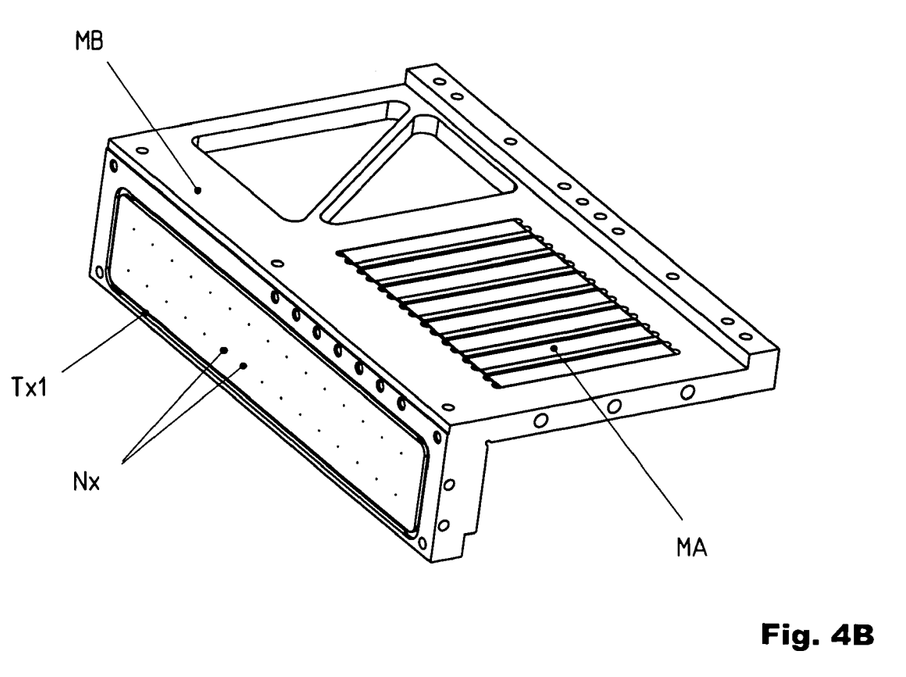

FIG. 4b also shows a perspective view of the movable part, however contrary to FIG. 4a not in a see through view. FIG. 4b depicts the trench $T_{x1}$ surrounding the nozzles $N_x$ as have been described above with reference to FIG. 3. Further, FIG. 4b shows the magnets MA forming part of the array of magnets as described with reference to FIG. 3.

It is remarked that FIGS. 4A and 4B show a slightly different embodiment of the movable part when compared to the embodiment according to FIG. 2, for example, instead of a single row with trenches $N_x$ a double row thereof is shown, while an oblique edge of the motor drive part as shown in FIG. 2 is not present in the embodiments as shown in FIG. 4, instead, these embodiments show a part having 2 triangularly shaped openings, the openings serving to reduce an weight of the movable part.

Figure 5:
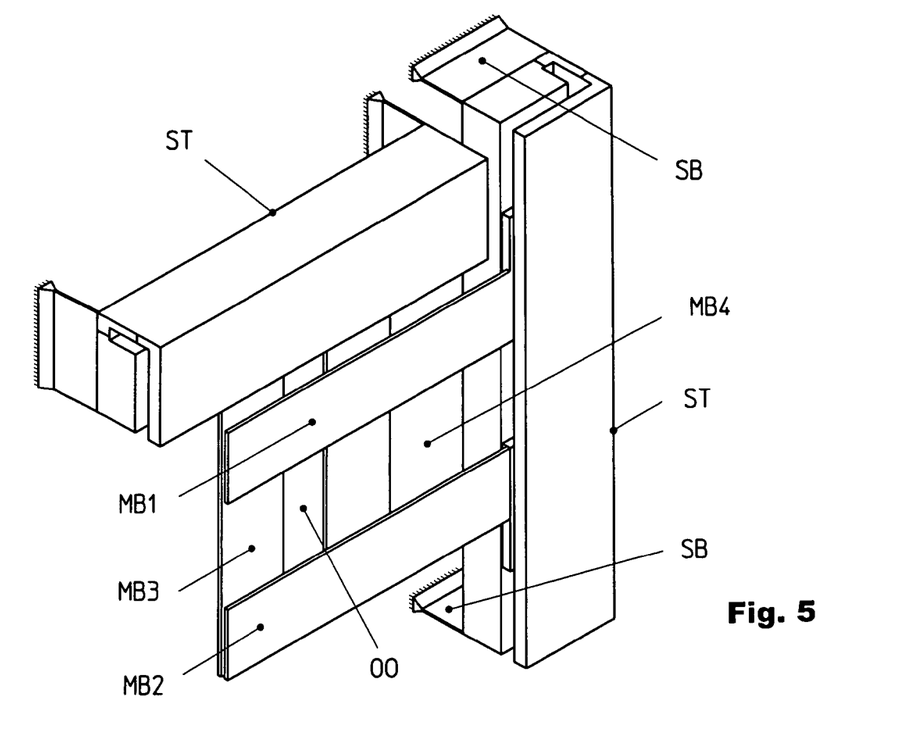
FIG. 5 depicts a perspective view of a reticle masking device according to an embodiment of the invention.

A reticle masking device including the guiding mechanism as described with reference to FIGS. 2-4 is depicted in FIG. 5. The reticle masking device includes a first guiding mechanism to guide the mask blades MB1, MB2 and a second guiding mechanism to guide the mask blades MB3 and MB4. The mask blades MB1 and MB2 are oriented substantially perpendicular to the mask blades MB3 and MB4. The mask blades MB1 to MB4 thus form an optical opening OO therebetween. In the embodiments shown in FIG. 5, each of the guiding mechanisms includes two movable parts, a movable part connected to the mask blade MB1 and a movable part connected to the mask blade MB2 respectively a movable part connected to the mask blade MB3 and a movable part connected to the mask blade MB4. Depending on a scanning movement of the reticle masking device, it may also be possible that only two of the mask blades, e.g. MB1 and MB2 are movable while the other two mask blades, e.g. MB3 and MB4 are substantially stationary during exposure. In the embodiments shown in FIG. 5, the guiding mechanisms are mounted to a remainder of the lithographic apparatus via spring blades SB to reduce a transfer of mechanical vibrations caused by a movement of one or more of the mask blades MB1-MB4 with respect to the stationary parts ST. A filtering of mechanical vibrations can be optimized by a suitable selection of a stiffness of the spring blade, a mass of the substantially stationary part ST, etc., as will be known to the skilled person.

Figure 6:
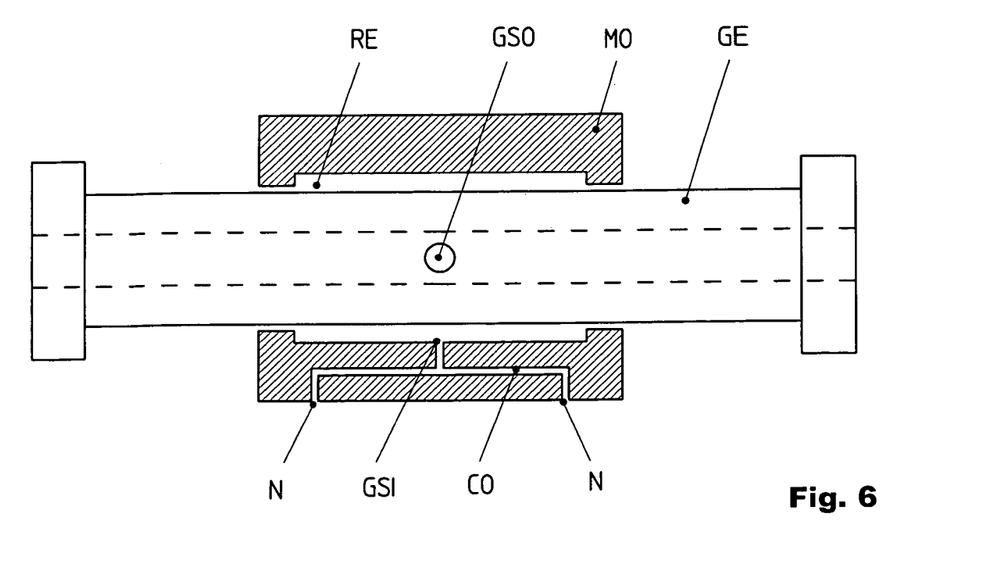
FIG. 6 schematically depicts details of another guiding mechanism according to an embodiment of the invention.

FIG. 6 highly schematically depicts an alternative embodiment of the contactless transfer of gas from the stationary part ST to the movable part MO as has been described above with reference to FIGS. 2-4. In the alternative embodiment, the stationary part ST includes a guiding element GE which extends through a recess in the movable part MO, the guiding element extending through the movable part in a direction of movement thereof. The guiding element includes a gas supply which is indicated by the dashed lines in the guiding element GE, the supply terminating in the gas supply outlet GSO of the guiding element. The gas flows via the gas supply outlet GSO in a recess RE in the movable part. The movable part MO further includes a gas supply inlet (schematically indicated by GSI and a conduct CO to guide the gas to one or more nozzles N in the movable part. An advantage of the configuration according to FIG. 6 is that a leakage of gas between the gas supply outlet GSO of the stationary part and the gas supply inlet GSI of the movable part MO is low, as leakage is collected in the recess RE while an opening between the recess RE and the guiding element GE is small, e.g. 20 micrometers near an end of the movable part MO, thus at the most narrow part of the recess RE as shown in FIG. 6. A range of movement of the movable part MO is given by a length of the recess RE in a direction from left to right in the plane of drawing of FIG. 6, in case that the movable element would move too far to the left or to the right, the gas supply outlet GSO which forms part of the stationary part ST would not fall within the recess anymore thus not enabling a transfer of the gas to the movable part MO.

A further alternative embodiment will be described below. Instead of using the gas leakage between the gas supply output GSO and the inlet trench IT in FIG. 3 as a preload on the gas bearing formed by the nozzles $N_x$, an alternative configuration is described below. In such an alternative embodiment, the counter weight part may include nozzles $N_x$ on both sides thereof, thus not only on the left side in the plane of drawing according to FIG. 3, but also on the right side thereof, thus at the surface where according to FIG. 3 the inlet trench IT is present. In this alternative embodiment, the inlet trench IT as well as the gas supply output GSO are then located e.g. at the bottom of the gap (i.e. at the bottom side of the counter weight part). The gas flowing out of the nozzles $N_x$ on both sides of the counter weight part of the movable part MO provide a preload for each other thus increasing a stiffness of the movable part MO in an x direction, while an upward force generated by a leakage of gas between the gas supply outlet GSO and the inlet trench IT may be counter-acted by a magnet at a suitable location in the movable part, the magnet in cooperation with a ferro magnetic material of the stationary part (such as an iron) generating a force to counter-act the force caused by the leakage of gas in the gap.

Figure 7:
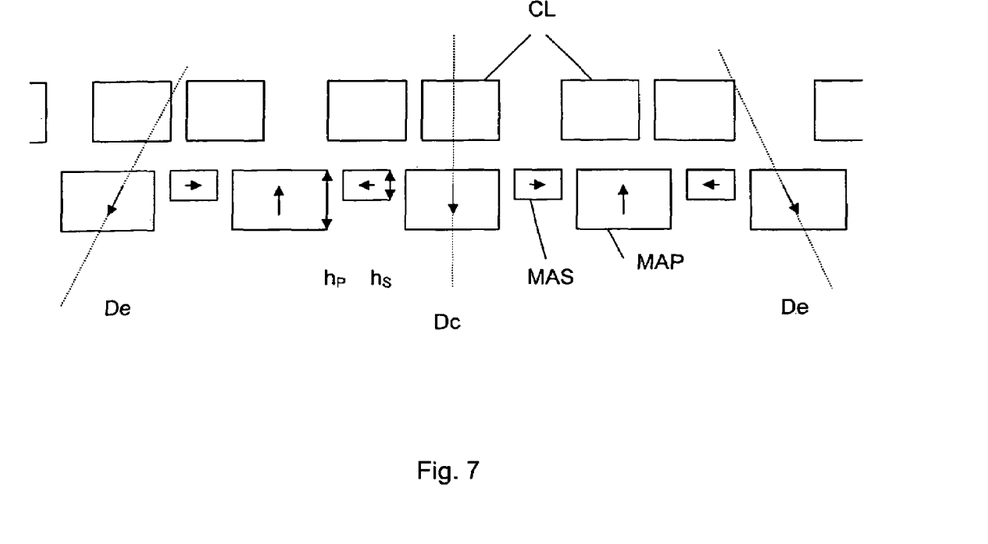
FIG. 7 depicts a magnet array comprised in the guiding mechanism according to an embodiment of the invention.

As depicted in FIG. 7, the array of magnets MA as described with reference to FIG. 3, may include an array of magnets in a Halbach configuration as described in U.S. Pat. No. 6,717,296 which is incorporated herein by reference. The Halbach magnet system includes an array of primary magnets MAP and an array of subsidiary magnets MAS having a polarization substantially perpendicular to the polarization of the array of primary magnets. In FIG. 7, the direction of polarization of the magnets is indicated by the arrows drawn in the magnets. In this preferred embodiment, a height $h_S$ of the subsidiary magnets (symbolically indicated in FIG. 7 by a double arrow) is smaller than a height $h_p$ of the primary magnets (also symbolically indicated in FIG. 7 by a double arrow), and in particular, the subsidiary magnets are positioned such that a centre thereof is located more close to the coils then a centre of the primary magnets. By this positioning, the following effect is achieved: The subsidiary magnets tend to increase a magnetic field at a location of the coils, while decreasing the magnetic field at the location of the stationary part facing the nozzles $N_Z$ of the movable part, thus at the side of the gas bearing formed by the nozzles $N_Z$. As explained elsewhere in this document, the magnetic field may be applied to form a preload for the gas bearing, thus requiring a certain spatial distribution of the magnetic field to be able to obtain a suitable effective magnetic attracting force between the movable part and the stationary part. By choosing a height and location of the subsidiary magnets with respect to the primary magnets, such spatial distribution of the magnetic field, and in particular a relation between a strength of the field in the plane of drawing of FIG. 7 above and below the magnet array, is determined. Thus, by choosing a suitable location and height of the subsidiary magnets in relation to the primary magnets, an Halbach effect may be tuned, e.g. to ensure that the magnetic field at the lower side of the magnets is not reduced to much by the presence of the subsidiary magnets to obtain a too low preload for the gas bearing, while at the same time obtaining by the presence of the subsidiary magnets an increase in the magnetic filed at the location of the coils, thus increasing a performance of the motor.

To obtain an as effective, as high magnetic field as possible, the array of primary and secondary magnets MAP, MAS is terminated at both its ends by a primary magnet MAP to obtain a high magnetic field near an end of the array. This would result in a change of the magnetic field at a location of the coils near the outside magnets of the array. Such a change of the magnetic field results in a torque on the movable part when operating the motor, thus when electrically powering the coil. Due to a spatial periodicity in the magnets and in the coils, the torque shows a ripple, resulting in a periodic fluctuation of the torque depending on a position of the movable part with respect to the stationary part. This torque, at certain positions of the movable part with respect to the stationary part, may rotate the movable part such that an edge of the movable part is pushed downward (in the plane of drawing according to FIG. 3). A stiffness of the gas bearing may not be high enough to prevent an undesired rotation of the movable part by this torque. In order to at least partly prevent the change of the magnetic field near the end, the primary magnets MAP at the end of the array, thus the outside primary magnets, may each include a direction of polarization De which differs from a direction of polarisation Dc of the other primary magnets, a difference between a direction of the polarization of the outside primary magnets and a direction of polarization of the primary magnets near a centre of the magnet array being, in an embodiment of the embodiment, at an angle between −30 and +30 degrees to obtain a maximum beneficial effect which will be described below. A direction of polarization De of one of the primary magnets at the end of the array is oriented towards a center axis of the magnet system a direction of polarization of the other one of the primary magnets at an opposite end of the array being oriented away from the centre axis of the magnet system. The direction of polarization Dc of the remainder of the primary magnets is oriented substantially parallel to such as centre axis. An effect of the altered direction of polarization of the outside primary magnets is that near an edge of the magnetic field generated by the primary and subsidiary magnets, the field at the location of the coils remains in substantially a same direction as a field at the location of the coils in or near a centre of the magnetic field (thus the field by the remainder of the primary and subsidiary magnets). As a result, the torque which may in operation cause the pushing of the edge of the movable part into the gas bearing is beneficially reduced: firstly, the position dependent ripple of the torque is reduced. Secondly, an average of the torque is altered, such that the torque in average (thus averaging over a periodicity of the ripple) more tends to lift the edge of the movable part from the gas bearing—which is considered less problematic—than to push the edge of the movable part into the gas bearing. Hence, a more stable, more precise moving of the movable part and a more favorable dynamic behavior thereof when driving the motor, may be obtained. To achieve a symmetrical and well balanced driving, the directions of polarization of the primary magnets at opposite ends of the array may be symmetrical with respect to the direction of polarization of the primary magnet near the centre of the array.

A benefit of the guiding mechanism according to embodiments of the invention is that a mass of the moving part can be kept low: as the nozzles are located in the moving part, the moving part may be substantially smaller than the stationary part in the direction of movement of the moving part with respect to the stationary part: in any position of the moving part within a range of movement thereof the nozzles in the moving part face a part of the stationary part, thus preventing an escape of the gas and associated loss of gas pressure which would occur when the nozzles would have been comprised in the stationary part instead of in the movable part. Therefore, a large range of movement may be combined with a low mass of the moving part, hence allowing displacement of the movable part at a high speed and over a large distance.

A further benefit of the guiding mechanism as described here is that e.g. flexible conducts or other flexible or deformable means to guide the gas to the movable part may be omitted, thus providing a long operational life to the guiding mechanism, avoiding contamination by substances comprised in such conducts, avoiding crosstalk due to the presence of the conduct, and/or decreasing a building volume of the guiding mechanism.

Due to the presence of the trenches, the gas can be recycled and/or drained, thus enabling a flow of a large amount of gas in the guiding mechanism. Such a large flow may be required due to the large possible dimensions of the guiding mechanism and the larger movable structures (such as mask blades) guided by it. A further advantage of the trenches is that by the draining and/or recycling of the gas, a deposit of the gas and/or of substances comprised in the gas, on lenses or other sensitive parts comprised in the lithographic apparatus may be prevented, as a contact between the gas and the lens or other parts may be prevented. Also, the draining may improve human safety when the gas would include any toxic and/or potentially dangerous substances.

A still further benefit of the guiding mechanism as described here is that the preload force acting between the magnets comprised in the movable part and (a ferromagnetic part of) the stationary part counteracts a deformation of the stationary part by forces generated in operation by the gas bearings formed by the nozzles $N_x$, $N_z$. The stationary part includes in this exemplary embodiment a structure which partly surrounds, i.e. is "wrapped" or "folded" around the movable part. As can best be seen from FIG. 3, the stationary part forms in the plane of drawing of FIG. 3 a structure which is open, in other words shows an opening at the right side in the plane of drawing. The gas bearings in operation formed by the nozzles $N_x$, $N_z$ provide for a force on the surfaces of the stationary part which face the gas bearings. As the stationary part forms an open structure, these forces tend to deform the stationary part in a way to further "open" the stationary part, i.e. increase the opening at the right side of the stationary part in the plane of drawing of FIG. 3. The magnetic forces by the magnets also results in a force on the stationary part. The magnets attract the stationary part (more precisely, the ferromagnetic parts of the stationary part as described elsewhere in this document), thus the magnetic forces tend to deform the stationary part in a way to "close" the stationary part, i.e. decrease the opening at the right side of the stationary part in the plane of drawing of FIG. 3. The magnetic forces can in operation to a large extent balance the gas bearing forces, thus preventing or at least reducing a deformation of the stationary part.

The various aspects, features and embodiments of the invention may be combined into a guiding mechanism as described here. It is however also possible to implement any of the aspects, features and/or embodiments separately, in other words: the various aspects, features and embodiments described in this document may be implemented individually or in an combination thereof. As an example, instead of the Halbach magnet array described here, a conventional magnet array may be applied. As a further example, the drainage system and associated trenches may be omitted.

The moving part may have any shape and may include one or a plurality of surfaces facing the gap, in which surfaces nozzles are comprised. These surfaces may be under any angle with respect to each other. As an example, instead of the shape as depicted in FIG. 3, where the movable part includes a shape of an L which has been rotated to the right by 90 degrees, the movable part may also include a shape similar to an U, an h, an H, an m or an M, or any other of such forms, while these forms may be found in any orientation in the movable structure (thus for example rotated to the left or to the right by 90 degrees, rotated by 180 degrees, etc.). In these examples, the substantially stationary part includes a shape which matches the shape of the movable part, thus the stationary part including a shape which has an opening which is substantially complementary to a shape of the movable part, to be able to guide the movable part by the stationary part while leaving a gap between the stationary and movable parts. Further, in these examples, any of the surfaces of such movable parts may include nozzles as described above to form one or more gas bearings.

The gas has supplied to the nozzles may include any gas, such as a nitrogen, an air, a cleaned and/or dried air, or any other gas. The gas may include a single gas or a mixture of gasses.

The gas has drained by the exhaust may be recycled, thus put under pressure again (e.g. by a suitable pump), may be exhausted or may be deposited in another part of the lithographic apparatus, e.g. used as a supply gas or cleaning gas to another part of the lithographic apparatus.

The movable structure may include any structure of any size, dimension and for any application. The movable structure is not necessarily movable per se, it may be made movable by the guiding mechanism. The guiding mechanism as described here may be used in any application where a (preferably linear) movement of a structure is to be realized. The guiding mechanism may be applied to achieve any range of movement for the movable structure.

The term substantially stationary is to be understood as substantially stationary with respect to the movable part. When applying spring blades to connect the substantially stationary part to the remainder of the lithographic apparatus, the substantially stationary part may move also when the movable part moves, however will come back to a rest or initial position when a movement of the stationary part due to e.g. a movement of the movable part or due to any other disturbance or vibration has damped out. Further, the substantially stationary part does not need to be stationary, instead it may be movable or in operation make a movement in any direction. Thus, the stationary part may also be referred to as a guiding part to guide the movable part. As an example, the guiding mechanism and movable structure guided by it may as a whole be movable by any other actuator, such as another guiding mechanism of the type described here.

The nozzle may include any type of gas nozzle comprising e.g. a single outlet opening, a porous gas outlet etc.

The term inject may include a transfer of the gas by the nozzle at any speed, at any pressure, directional as well as omni-directional or hemispheric. The injection of the gas may be continuous to provide a constant, stable bearing of the movable part, however any other type of injection, such as pulsed, in bursts etc may be applicable too.

The gas supply inlet of the movable part may have any shape, preferably it comprises a trench having a direction as outlined above.

It will be appreciated that any type of supply conduct in the movable part may be applicable, including bores or holes in the movable part, as well as any other type of known gas conduct.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be appreciated by one skilled in the art that modifications may be made to the invention as described without departing from the scope of the claims set out below.

What is claimed is:
1. A guiding mechanism for use in a lithographic mechanism, said guiding mechanism configured to guide a movable structure and comprising:
  (a) a movable part connected to the movable structure, and
  (b) a substantially stationary part configured to guide the movable part,
  wherein the movable part comprises
    (i) a nozzle configured to inject gas in a gap between the movable part and the stationary part,
    (ii) a gas supply inlet, and
    (iii) a gas supply conduit,
  wherein the stationary part comprises a gas supply outlet configured to supply gas via a part of the gap to the gas supply inlet arranged in the movable part, and
  wherein the gas supply conduit is configured to guide the gas from the gas supply inlet to the nozzle.

2. The guiding mechanism of claim 1, wherein the gas supply inlet comprises an inlet trench arranged in a surface of the movable part facing the gap, the inlet trench being orientated substantially parallel to a direction of movement of the movable part with respect to the substantially stationary part.

3. The guiding mechanism of claim 1, wherein the gas supply inlet of the movable part and the nozzle are located on surfaces on opposite sides of the movable part.

4. The guiding mechanism of claim 1, wherein the movable part comprises a first surface comprising a first nozzle and a second surface comprising a second nozzle, the first and second surfaces being substantially perpendicular to each other and each facing at least a part of the gap.

5. The guiding mechanism of claim 4, wherein the guiding mechanism further comprises a motor, said motor including a first part arranged in a motor drive part of said movable part and a second part arranged in the stationary part, said first part being configured to cooperate with the second part to move the movable part, the movable part further comprising a counter weight part that is connected to a side of the motor drive part that faces away the movable structure.

6. The guiding mechanism of claim 5, wherein the motor drive part comprises the first surface, the first surface being substantially parallel to a surface of the movable structure, and wherein the counter weight part comprises the second surface.

7. The guiding mechanism of claim 6, wherein the first part of the motor drive part comprises a magnet and the second part of the stationary part comprises a coil.

8. The guiding mechanism of claim 7, wherein the stationary part comprises a ferro magnetic material arranged on a side of the stationary part that faces the first surface of the motor part, the ferro magnetic material being configured to cooperate with the magnet to generate a preload on a gas bearing formed by the first nozzle.

9. The guiding mechanism of claim 8, wherein the magnet and the coil are positioned relative to the first nozzle such that a maximum preload force of the preload substantially coincides with a maximum force generated by the gas bearing formed by the first nozzle.

10. The guiding mechanism of claim 7, wherein the stationary part partly surrounds the movable part along a direction of movement of the movable part, and wherein a force generated by the magnet arranged in the movable part and acting on a ferromagnetic part of the stationary part partly compensates a gas bearing force generated by a gas bearing formed by the first nozzle.

11. The guiding mechanism of claim 1, wherein the movable part comprises a drainage trench arranged on a surface thereof, the drainage trench enclosing the nozzle arranged in the movable part to drain gas injected into the gap by the nozzle, and wherein the stationary part includes a gas exhaust to discharge the gas from the drainage trench.

12. The guiding mechanism of claim 11, wherein the gas exhaust comprises an exhaust conduit arranged in the stationary part, wherein the drainage trench is provided in the surface of the movable part facing the exhaust conduit, the drainage trench being orientated substantially parallel to a direction of movement of the movable part with respect to the substantially stationary part.

13. The guiding mechanism of claim 1, wherein the movable part comprises a magnet configured to generate an attracting force between the movable part and a ferromagnetic part that is arranged in said stationary part, the attracting force at least partly compensating a force due to a gas leakage between the gas supply outlet of the stationary part and the gas supply inlet of the movable part.

14. The guiding mechanism of claim 1, wherein the stationary part comprises a guiding element, the guiding element extending in a direction of movement of the movable part through a recess in the movable part, wherein the gas outlet is arranged in the guiding element, and wherein the gas supply inlet is arranged in the recess.

15. The guiding mechanism of claim 1, wherein the stationary part is mounted in the lithographic apparatus via a spring blade.

16. The guiding mechanism of claim 1, wherein the movable part comprises a magnet system arranged in a Halbach configuration, said magnet system comprising a primary magnet system and a subsidiary magnet system, a direction of polarization of a primary magnet of the primary magnet system at an end of the magnet system differing from a direction of polarization of a primary magnet near a centre of the magnet system.

17. The guiding mechanism of claim 16, wherein the direction of the polarization of the primary magnet at the end of the magnet system and the direction of polarization of the primary magnet near a centre of the magnet system form an angle between about −30 and +30 degrees.

18. The guiding mechanism of claim 17, wherein directions of polarization of primary magnets at opposite ends of the magnet system are symmetrical with respect to the direction of polarization of the primary magnet near the centre of the magnet system.

19. The guiding mechanism of claim 1, wherein the movable structure comprises a mask blade to mask an edge of the patterning device.

20. A reticle masking device for use in a lithographic apparatus, the device comprising:
   (a) a mask blade, and
   (b) a guiding mechanism configured to guide the mask blade, the guiding mechanism comprising:
      (i) a movable part connected to the mask blade, and
      (ii) a substantially stationary part to guide the movable part,
      wherein the movable part comprises
         (1) a gas nozzle configured to inject gas in a gap between the movable part and the stationary part,
         (2) a gas supply inlet, and
         (3) a gas supply conduit,
      wherein the stationary part comprises a gas supply outlet configured to supply gas via a part of the gap to the gas supply inlet arranged in the movable part, and
      wherein the gas supply conduit is configured to guide the gas from the gas supply inlet to the nozzle.

21. A lithographic apparatus comprising:
an illumination system configured to condition a beam of radiation;
a patterning device support configured to support a patterning device, the patterning device configured to pattern the beam of radiation to form a patterned beam of radiation;
a substrate support configured to hold a substrate;
a projection system configured to project the patterned beam of radiation onto a target portion on the substrate, and
a guiding mechanism configured to guide a movable structure within the lithographic apparatus, the guiding mechanism comprising:
   (a) a movable part connected to the movable structure, and
   (b) a substantially stationary part configured to guide the movable part,
   wherein the movable part comprises
      (i) a nozzle configured to inject gas in a gap between the movable part and the stationary part,
      (ii) a gas supply inlet, and
      (iii) a gas supply conduit,
   wherein the stationary part comprises a gas supply outlet configured to supply gas via a part of the gap to the gas supply inlet arranged in the movable part, and
   wherein the gas supply conduit is configured to guide the gas from the gas supply inlet to the nozzle.

22. The lithographic apparatus of claim 21, wherein the movable structure comprises a mask blade that is configured to mask an edge of the patterning device.

* * * * *